US007955901B2

(12) United States Patent
Ewe et al.

(10) Patent No.: US 7,955,901 B2
(45) Date of Patent: Jun. 7, 2011

(54) METHOD FOR PRODUCING A POWER SEMICONDUCTOR MODULE COMPRISING SURFACE-MOUNTABLE FLAT EXTERNAL CONTACTS

(75) Inventors: Henrik Ewe, Burglengenfeld (DE); Stefan Landau, Wehrheim (DE); Klaus Schiess, Allensbach (DE); Robert Bergmann, Regensburg (DE); Alvin Wee Beng Tatt, Malacca (MY); Soon Lock Goh, Malacca (MY); Joachim Mahler, Regensburg (DE); Boris Plikat, Tegernheim (DE); Reimund Engl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 235 days.

(21) Appl. No.: 11/867,329

(22) Filed: Oct. 4, 2007

(65) Prior Publication Data
US 2009/0093090 A1    Apr. 9, 2009

(51) Int. Cl.
    *H01L 23/48*    (2006.01)
(52) U.S. Cl. ........ 438/123; 438/109; 438/111; 438/112; 257/666; 257/672; 257/674
(58) Field of Classification Search .................... None
    See application file for complete search history.

(56) References Cited

U.S. PATENT DOCUMENTS

| 5,480,835 A | 1/1996 | Carney et al. |
| 5,480,839 A | 1/1996 | Ezawa et al. |
| 5,637,922 A | 6/1997 | Fillion et al. |
| 6,246,327 B1 | 6/2001 | Eberhardt |
| 6,309,915 B1 * | 10/2001 | Distefano ............ 438/127 |
| 6,518,653 B1 * | 2/2003 | Takagi ............... 257/677 |
| 6,630,726 B1 * | 10/2003 | Crowley et al. ....... 257/666 |
| 6,756,252 B2 | 6/2004 | Nakanishi |
| 6,841,857 B2 * | 1/2005 | Beer et al. ........... 257/675 |
| 6,913,944 B2 | 7/2005 | Hirai |
| 7,479,691 B2 * | 1/2009 | Ewe et al. ........... 257/666 |
| 2003/0015774 A1 | 1/2003 | Auburger et al. |
| 2004/0014309 A1 * | 1/2004 | Nakanishi ........... 438/614 |
| 2004/0129937 A1 | 7/2004 | Hirai |

(Continued)

FOREIGN PATENT DOCUMENTS

DE    10103144    8/2002

(Continued)

OTHER PUBLICATIONS

Yasunari Ukita, Kasuki Tateyama, Masso Segawa, Yoshiki Endo, Application of Conductive Pase containing Silver Nanoparticles to Power Transistor Package , Feb. 3-4, 2005, 11th (Symposium on Microjoining and Assembly Technology in Electronics.*

(Continued)

*Primary Examiner* — Bradley K Smith
*Assistant Examiner* — Mohammad Choudhry
(74) *Attorney, Agent, or Firm* — Dicke, Billig & Czaja, PLLC

(57) ABSTRACT

A method for producing a power semiconductor module having surface mountable flat external contact areas is disclosed. At least one power semiconductor chip is fixed by its rear side on a drain external contact. An insulation layer covers the top side over the side edges of the semiconductor chip as far as the inner housing plane was a leaving free the source and gate contact areas on the top side of the semiconductor chip and also was partly leaving free the top sides of the corresponding external contacts.

25 Claims, 8 Drawing Sheets

U.S. PATENT DOCUMENTS

| | | |
|---|---|---|
| 2004/0164363 A1* | 8/2004 | Black et al. .................... 12/37 |
| 2005/0048680 A1* | 3/2005 | Matsunami .................... 438/21 |
| 2005/0153078 A1 | 7/2005 | Bentley et al. |
| 2005/0266154 A1 | 12/2005 | Devos et al. |
| 2006/0158470 A1 | 7/2006 | Vanheusden et al. |
| 2006/0192290 A1* | 8/2006 | Seliger et al. ............... 257/774 |
| 2007/0017565 A1 | 1/2007 | Nakagiri et al. |

FOREIGN PATENT DOCUMENTS

| | | |
|---|---|---|
| DE | 10308928 | 9/2004 |
| EP | 0696818 | 2/1996 |
| WO | 03030247 | 4/2003 |
| WO | 2004077548 | 9/2004 |
| WO | 2005101458 | 10/2005 |
| WO | 2006058510 | 6/2006 |

OTHER PUBLICATIONS

"Planar Metallization Interconnected 3-D Multi-Chip Module", Zhenxian Liang, et al., IEEE 2003 (5 pgs.).

* cited by examiner

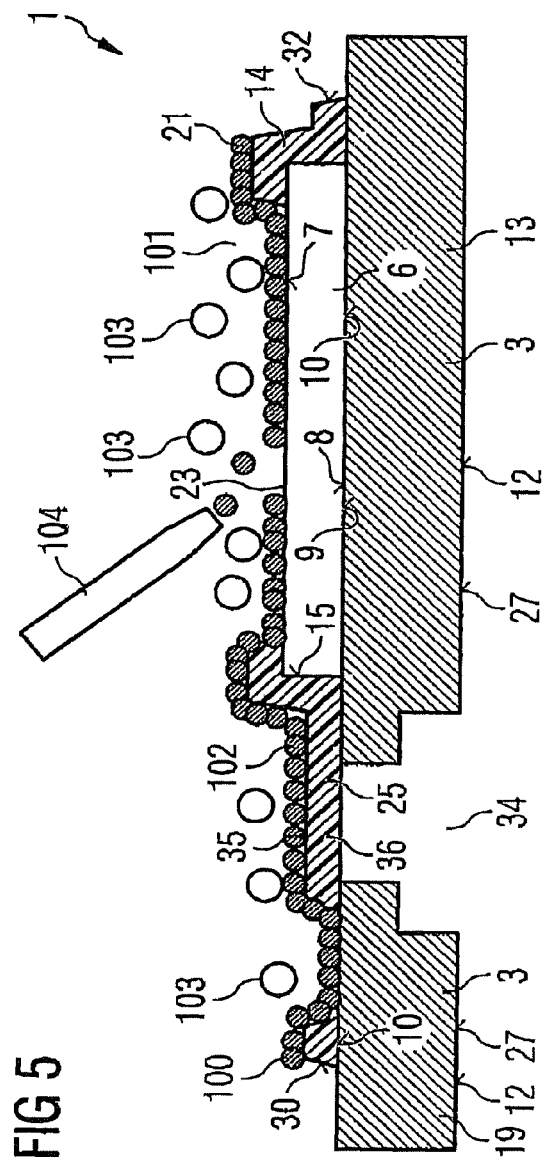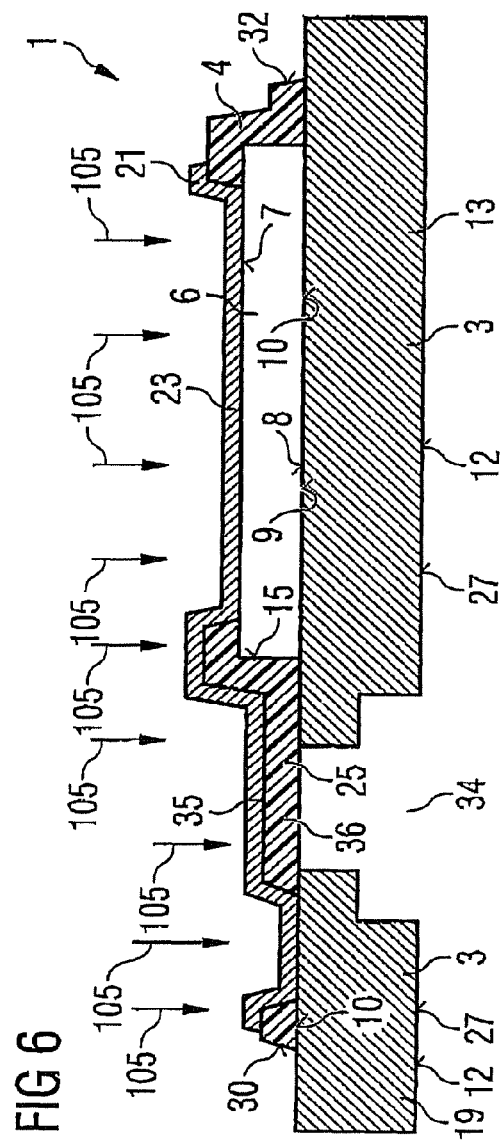

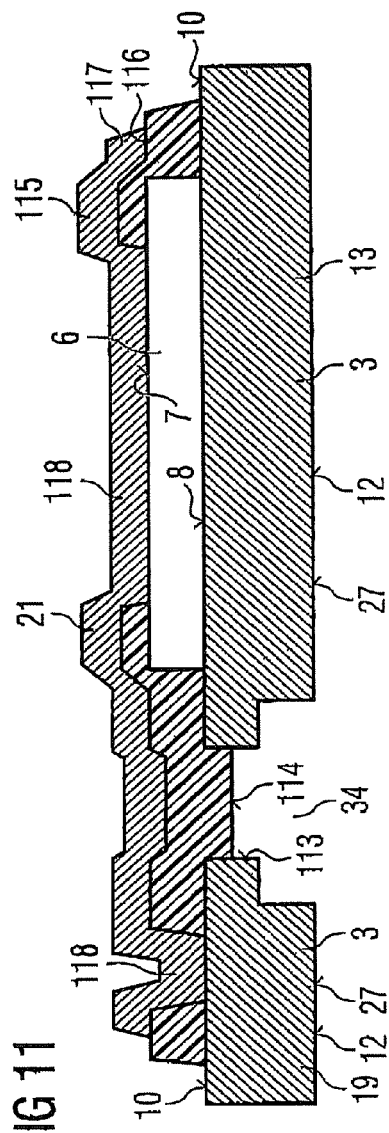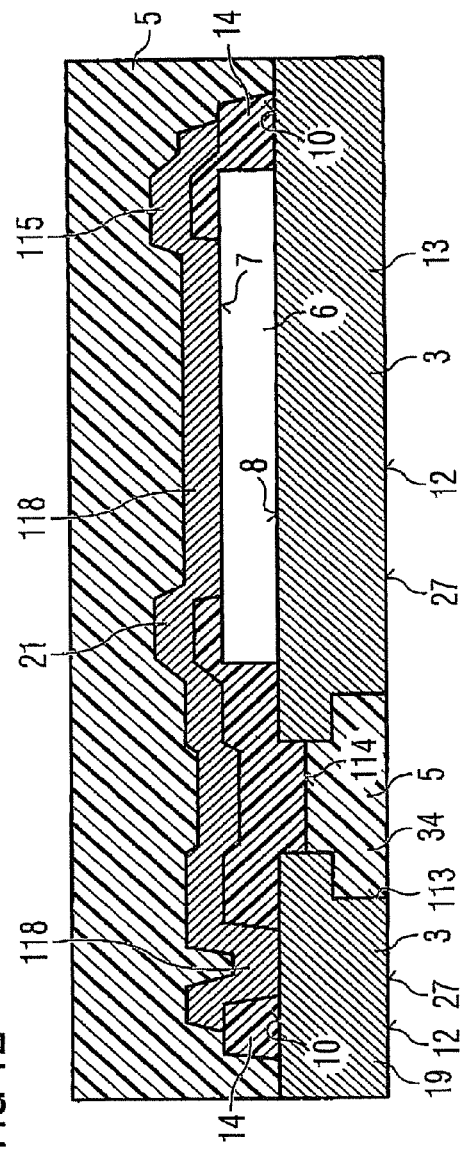

METHOD FOR PRODUCING A POWER SEMICONDUCTOR MODULE COMPRISING SURFACE-MOUNTABLE FLAT EXTERNAL CONTACTS

BACKGROUND

The application relates to a power semiconductor module in a plastic housing having surface-mountable flat external contacts and to a method for producing the same using a planar connecting technique on a metallic leadframe. In the case of such a power semiconductor module having surface-mountable flat external contacts, the external contact areas of the external contacts are arranged on the underside of the semiconductor module. Such a power semiconductor module has at least one power semiconductor chip, the top side of the power semiconductor chip having source contact areas and gate contact areas and the rear side of the semiconductor chip having a drain contact area.

Making contact with power semiconductor devices, in particular power semiconductor modules having a high current density in a plastic housing, is problematic owing to the high evolution of heat loss. This is because said heat loss has to be dissipated within the plastic housing via connections with the highest possible electrical and thermal conductivity from the contact areas of the semiconductor chip to corresponding connection contacts of a metallic leadframe.

One conventional connecting technique is wire contact-making. In this case, the connections are produced by using bonding wires made of gold or aluminum, the contact between the bonding wires and the contact areas on the semiconductor chip and also the contact areas on a leadframe arising as a result of the metals involved being alloyed with energy being supplied. However, the relatively small cross-sectional areas of the wire connections are critical for a high connecting resistance. Moreover, such wire connections are an obstacle to further shrinking of the contact areas on the top side of the semiconductor chip, advancing chip miniaturization and increasing integration.

Further disadvantages of such bonding wire technologies are the thermomechanical loading on the semiconductor chip upon contact-making and the possible bonding wire drifting in the course of molding composition encapsulation of the module components in the course of embedding into a plastic housing composition. Furthermore, a further weak point for instances of bonding wires being torn away are the molten and subsequently recrystallized regions at the contact areas. Ageing processes of the alloy compounds are observed there, diffusion processes constituting a creeping increase in the contact resistance and hence a reliability problem for the power semiconductor module.

An alternative has been developed for P-TDSON housings (Plastic Thin Dual Small Outline Non leaded package). This alternative contact-making method is also known by the term "clamping clip method", a metal clip instead of the bonding wires enabling large-area contact to be made with the source contact areas on account of its larger cross-sectional area, which leads to a reduction of the electrical resistance. At the same time, the clamping clip method improves the dissipation of heat from the chip top sides by virtue of a reduced thermal resistance and an increased heat buffer capacity of such a clamping clip connection. However, on account of its dimensions, the clip construction limits advancing and improved integration of power semiconductor chips in corresponding power semiconductor modules.

The flexibility of such clip structures is low with regard to the arrangement of the bonding contact areas, for which reason a change in each case necessitates a new clip construction. The contact-making on the contact areas of the semiconductor chip or on the contact pads of the "leadframe" is effected by soldering using a solder paste. The elimination of flux residues by a subsequent cleaning process forms a critical operation in this case. The flux residues have perfect adhesion on the components in the course of embedding and adversely influence the reliability of the power semiconductor module. In addition, fatigue cracks in the solder connections in the event of thermomechanical loading are a reliability problem.

The document WO 2004/077584 A2 discloses large-area metal coatings which are applied to an insulation layer of a substrate and in this case simultaneously produce the connection to contact areas on the top side of semiconductor chips. This technology requires, as the leadframe, a correspondingly prepared large-area substrate such as is known as a wiring substrate for BGA devices. Such prerequisites of a large-area plane substrate are not imposed, however, in the case of device housings such as the P-TDSON housing or P-VQFN housing (Plastic Very thin profile Quad Flat Non leaded package).

The document U.S. Pat. No. 5,637,922 also offers solutions with metal layers applied in large-area fashion and works on the basis of a conventional leadframe with flat conductors projecting laterally from the housing. Furthermore, the publication "Planar Metallization Interconnected 3-D Multichip Module" by Zhenxean Liang et al., 53. Electronic Compounds and Technology Conference 2003, pages 1090-1094, discloses orienting power semiconductor devices made of silicon with ceramic substrates in such a way that large-area metal coatings on the coplanar top side including ceramic substrate and semiconductor chip surface become possible without great disturbances. However, even this solution has the disadvantage that it is not very flexible and cannot readily be applied to power semiconductor modules including a plastic housing and including surface-mountable contacts such as the P-TDSON or the P-VQFN housings offer or have.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 5 illustrates the deposition of a connecting layer for a power semiconductor module according to a fourth embodiment.

FIG. 6 illustrates the deposition of a connecting layer for a power semiconductor module according to a fifth embodiment.

FIGS. 7 to 12 illustrate a method for producing a power semiconductor module according to a sixth embodiment.

FIG. 7 illustrates a lead frame onto which a power semiconductor chip is then mounted.

FIG. 8 illustrates the introduction of filler material in spaces between portions of the lead frame of FIG. 7.

FIG. 9 illustrates the application of an insulation layer to the top surface of the components of FIG. 8.

FIG. 10 illustrates the removal of the further material.

FIG. 11 illustrates the deposition of an electrically conductive connecting layer on the insulation layer of FIG. 10.

FIG. 12 illustrates the power semiconductor module after a molding process to produce a plastic housing.

DETAILED DESCRIPTION

Figure 1:
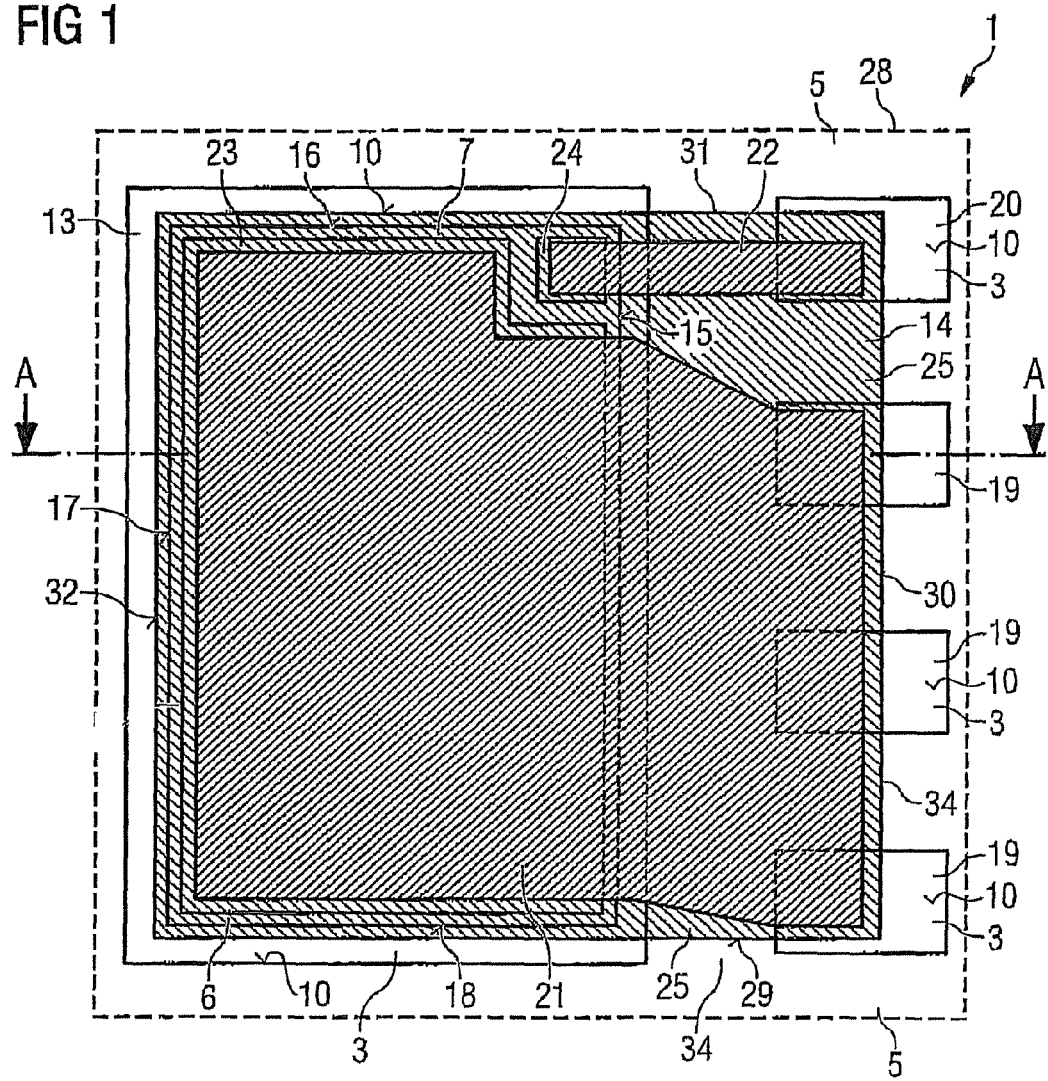
FIG. 1 illustrates a schematic plan view of a power semiconductor module of a first embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Among other things, aspects of the present invention provide contact-making possibilities within power semiconductor modules in plastic housings which can keep up with the miniaturization particularly in the case of P-TDSON or P-VQN housings and can be adapted to the continuous miniaturization.

In one embodiment, the invention provides a power semiconductor module having surface-mountable flat external contacts which provide external contact areas on the underside of the power semiconductor module. The power semiconductor module has at least one power semiconductor chip having source contact areas and gate contact areas and the rear side of the semiconductor chip having a drain contact area. The flat external contacts have top sides arranged in an inner housing plane. The drain contact area of the rear side of the semiconductor chip is fixed on the top side of a drain external contact. An insulation layer, an insulation film, covers the top side and edge sides of the semiconductor chip, and also the housing plane whilst leaving free the source and gate contact areas on the top side of the semiconductor chip. Furthermore, the insulation layer covers the top sides of the source and gate external contacts whilst leaving free contact pads. In this case, the insulation layer bridges an interspace between the external contacts in the region of the inner housing plane in approximately planar fashion.

A further embodiment of the invention relates to a power semiconductor module having surface-mountable flat external contacts which are provided on the underside of the semiconductor module. This power semiconductor module has at least one power semiconductor chip, the top side of the power semiconductor chip having source contact areas and gate contact areas and the rear side of the semiconductor chip having a drain contact area. Moreover, the flat external contacts have top sides arranged in an inner housing plane and having external contact areas on the underside of the plastic housing.

In this case, the drain contact area of the semiconductor chip is fixed on the top side of a drain external contact. An insulation film covers the top side and the edge sides of the semiconductor chip and also the housing plane whilst leaving free the source and gate contact areas on the top side of the semiconductor chip and also whilst partly leaving free the top sides of the source and gate external contacts. Arranged on said insulation film is a metallic source connecting layer as high-current stripline, which extends on the insulation film from the source contact areas to the top sides of the source external contacts. Furthermore, arranged on the insulation film is at least one gate connecting layer as signal stripline, which extends from the gate contact areas on the semiconductor chip to the top side of the gate external contact whilst bridging the interspace between the external contacts.

These power semiconductor modules have the advantage that the source contact areas on the top side of the semiconductor chip are interconnected to form a large-area connecting layer, in which case both the pitch of the source contact areas and the areal extent of the individual source contact area can be decreased as desired without a reliable connection to the areal metalization layer on the insulation layer tearing away. The same applies to the gate contact areas, which are brought together to form a smaller coating region and from there are directly connected to the top side of a gate external contact similarly to the source contact areas on the top side of the semiconductor chip via a corresponding gate connecting layer. Apart from the insulation layer, no further substrates or intermediate layers are required in order to electrically connect the source contact areas or the gate contact areas to the corresponding top sides of the external contacts in the region of the housing underside. In this case, it is furthermore possible to dispense with external flat conductors that extend toward the outside and take up a lot of space, and to manage completely with the available underside of the power semiconductor module for contact-making.

A further embodiment is that the miniaturization of such power semiconductor modules can now advance without new clamping clips having to be developed or corresponding external flat conductors or wiring substrates such as are still used in the prior art having to be adapted to the connecting layers or to the form of the semiconductor chip.

In a further embodiment, the insulation layer has a patterned insulation film that is laminated on. Such an insulation film which, on the one hand, covers the coplanar housing plane in so far as it is not taken up by the semiconductor chip with its drain contact, and moreover clings to the edges of the semiconductor chip and to the top side of the semiconductor chip is associated with the advantage that high flexibility becomes possible in the construction of a power semiconductor module and such power semiconductor modules can be produced inexpensively by cost-effective lamination of differently patterned layers or films on the top sides of the external contacts and on the top sides of the semiconductor chips.

As is generally known, insulation films are not rigid, but rather follow the thermal stresses by compensating expansion or contraction and afford the advantage that the connecting layer arranged thereon both for the source contact areas and for the gate contact areas can follow this expansion behavior without the occurrence of embrittlement or microcracking as are known from bonding wires. Such a film has the further advantage that it adapts to the conditions on the coplanar housing plane and can encapsulate without stresses the semiconductor chip arranged with its drain contact area on the coplanar housing plane. For this purpose, during the application of the insulation film, the entire system is heated to the softening temperature of the film. A further advantage is that the connecting film forms a bridge that bridges between the external contacts in the region of the inner coplanar housing plane in approximately planar fashion and provides a platform for the application of the connecting layers.

In a further embodiment, the source and gate connecting layers have a multilayer metal layer. Said multilayer metal layer may have one lower metal layer for adhesion promotion and for improving the contact-making with the source contact areas and gate contact areas with which contact is to be made and may have a further metal ply, which ensures the required thickness for a low-resistance connection of the source and gate contact areas, respectively, to the corresponding source and gate external contacts.

In a further embodiment of the invention the source connecting layer and/or gate connecting layer has an upper metal layer made of copper or a copper alloy. This embodiment has the advantage that copper is a guarantee of a low-resistance electrical connection, and that said copper can be deposited with a large thickness by using electrodeposition or chemical deposition on the top side of the insulation layer or the insulation film. Since this copper layer is not situated solely on the top side of the semiconductor chip, but rather must also reach as far as the coplanar inner housing plane, this low-resistance coating cannot already be applied in preparatory fashion on the corresponding semiconductor wafer, rather it is necessary to provide this deposition operation for the completion and mounting of the power semiconductor module.

Furthermore, the power semiconductor module likewise has a copper layer or a copper alloy at the flat surface-mountable external contacts. This copper layer or copper alloy was patterned from a sheet-metal strip into corresponding structures for the source external contact areas, the drain external contact area and/or the gate external contact area. An etching technique is may used for this purpose. Solderable coatings may likewise be applied to the undersides of the external contacts. These solderable coatings have the advantage that the surface mounting of the external contacts of the power semiconductor module can be combined in a very simple manner with corresponding superordinate circuit boards.

In a further embodiment of the invention, the power semiconductor module has one or a plurality of stacked semiconductor chips on the power semiconductor chip, which are fixed on the top side of a power semiconductor chip in such a way that they take up part of the top side of the power semiconductor chip. Logic components may be used as stacked semiconductor devices, the areal extent of said logic components being smaller than that of the power semiconductor chips. For the wiring of these stacked semiconductor chips on the power semiconductor chips, it is likewise possible to use the technique disclosed above with insulation layer and metallic connecting layers.

In the case of the stacked semiconductor device, it is even possible also to provide internal connecting layers between contact areas of the stacked semiconductor chip and contact areas of the power semiconductor chip. This can be effected by using the same method process as the application of the connecting layers on the remaining components of the power semiconductor module. The corresponding connecting layers are thus produced at the same time as the connecting layers between source contact areas and source external contacts and also between gate contact areas and gate external contacts.

With the use of an insulation film, it is possible to ensure that the source and gate contact areas are kept free on the top side of the semiconductor chip by using the insulation film having correspondingly stamped regions with passage openings prior to the application of said insulation film. Such a stamping technique is advantageous in the production of large-area contacts on the top side of the semiconductor chip and/or the top side of the external contacts. If, however, only small passage openings have to be provided through the insulation film, then it is advantageous firstly to apply the insulation film and then to achieve by using laser ablation the situation in which the source contact areas and/or the gate contact areas are kept free on the top side of the semiconductor chip.

A method for producing a power semiconductor module including surface-mountable flat external contacts arranged on the underside of the plastic housing has the following method processes.

The first process involves producing an arrangement of flat external contacts for the surface-mountable semiconductor module in a flat conductor frame, the top sides of the external contacts being oriented in plane fashion and forming a coplanar inner housing plane. Moreover, a semiconductor chip is produced, the top side of the semiconductor chip having source contact areas and gate contact areas and the rear side of the semiconductor chip having a drain contact area. Said semiconductor chip is subsequently fixed by its drain contact area on its rear side on a top side of a drain external contact of the flat conductor frame.

A patterned insulation layer is then applied to this structure, said insulation layer being applied to the edge sides and the top side of the semiconductor chip and the coplanar housing plane whilst leaving free the source and gate contact areas and whilst partly leaving free the top sides of the external contacts. Finally, a patterned metal layer is applied as a planar connecting layer between source contact areas and surfaces of the source external contacts and also between gate contact areas on the top side of the semiconductor chip and the surfaces of the gate external contacts. After the application of this connecting layer, the finished components can then be embedded into a plastic housing composition, the external contacts projecting from the plastic housing composition with their external contact areas on the underside of the plastic housing.

This method has the advantage that, with increasing miniaturization, the insulation layer and the metallic connecting layer can also be reduced in size without any problems. Moreover, this method has the advantage that the entire construction of the semiconductor module can be effected on a flat conductor frame which only has external contacts and provides the latter on the underside of the semiconductor module.

Finally, the method with the planar connecting technique provided has the advantages of:
  1. A low electrical resistance and a high effective dissipation of heat from the chip top side on account of the large connecting cross section in comparison with conventional bonding wires;
  2. Fast and low-loss switching as a result of reduced leakage inductances of the relatively flat connecting layer;
  3. The simultaneous production of all the connections and becomes continuously more as the number of connections that are to be produced in a housing increases;
  4. A significantly higher integration density as a result of the reduction of the minimum contact area sizes required for the source contact areas and the gate contact areas;

5. High flexibility of the patterning process in conjunction with constructional changes in the contact area geometries;
6. Lining of the contact areas with a diffusion-inhibiting and/or adhesion-improving layer below the connecting layer, thereby avoiding reliability-relevant weak points at the metal contact points;
7. A stack construction with an alternate sequence of insulation and connecting layers, which affords diverse possibilities of line disentanglement as a result of the multilayer nature of the wiring layer;
8. A smaller structural height of the connection, which ultimately enables a flat housing construction.

Although planar connecting techniques exist in various embodiments, as mentioned above, application has hitherto been restricted to insulating substrates. The present application realizes the use of a planar connecting technique in a leadframe-based plastic housing, in the case of which the insulation layer applied first forms a bridge carrying the connecting layer over the trenches between the drain external contact, on which the chip is arranged, and the further housing external contacts. The method described above thus involves successively applying an insulation layer and a metallic connecting layer to the leadframe populated with one or a plurality of semiconductor chips and also patterning them, to be precise in a manner which leads to large-area, flat connections between the contact areas of the semiconductor chip and the top sides of the external contacts.

In an implementation of the method, for the purpose of fixing the semiconductor chip, the latter is soldered on by its drain contact area on a top side of a drain contact of the flat conductor frame. In preparation for the soldering-on process, either the top side of the drain external contact may have a solder layer and/or the rear side of the semiconductor chip may be provided with a solder layer.

In a further embodiment, an electrically conductive adhesive is used instead of the solder layer. Said electrically conductive adhesive may also be realized by a double-sided adhesive, but electrically conductive film. This has the advantage that it is possible to avoid extreme heating for joining the semiconductor chip onto the drain external contact, especially as the temperatures for curing the adhesive layer or the adhesive film are tens of ° C. lower than the required temperatures for a soldering-on process.

As described above, an insulation film may be used in this method in order to bridge the trenches between the individual external contact areas of the coplanar inner housing plane until all the assembled components are embedded in a plastic housing composition in the concluding method process. If an insulation film is used as the insulation layer, then it may already be prepared, prior to application, in such a way that corresponding passage openings are stamped in at the locations at which it is necessary to have access to the top sides of the external contacts and also access to the source contact areas and/or the gate contact areas on the top side of the semiconductor chip.

During a subsequent patterning of the insulation film, the corresponding source contacts or gate contacts and the corresponding regions of the top sides of the external contacts can be uncovered by laser ablation. The connecting layer may be applied ply by ply, a lower first ply being deposited by using a sputtering method and this sputtered layer subsequently being the basis for depositing a second, correspondingly thicker connecting layer by using an electrolytic method. An adhesion-promoting and/or a diffusion-inhibiting electrically conductive ply may be applied as the first ply in order from the outset to avoid adhesion problems and/or embrittlement problems as a result of diffusion and formation of intermetallic phases. The above method may be used for producing semiconductor modules in particular in P-TDSON housings and/or in P-VQFN housings or modifications of these housing types.

Figure 2:
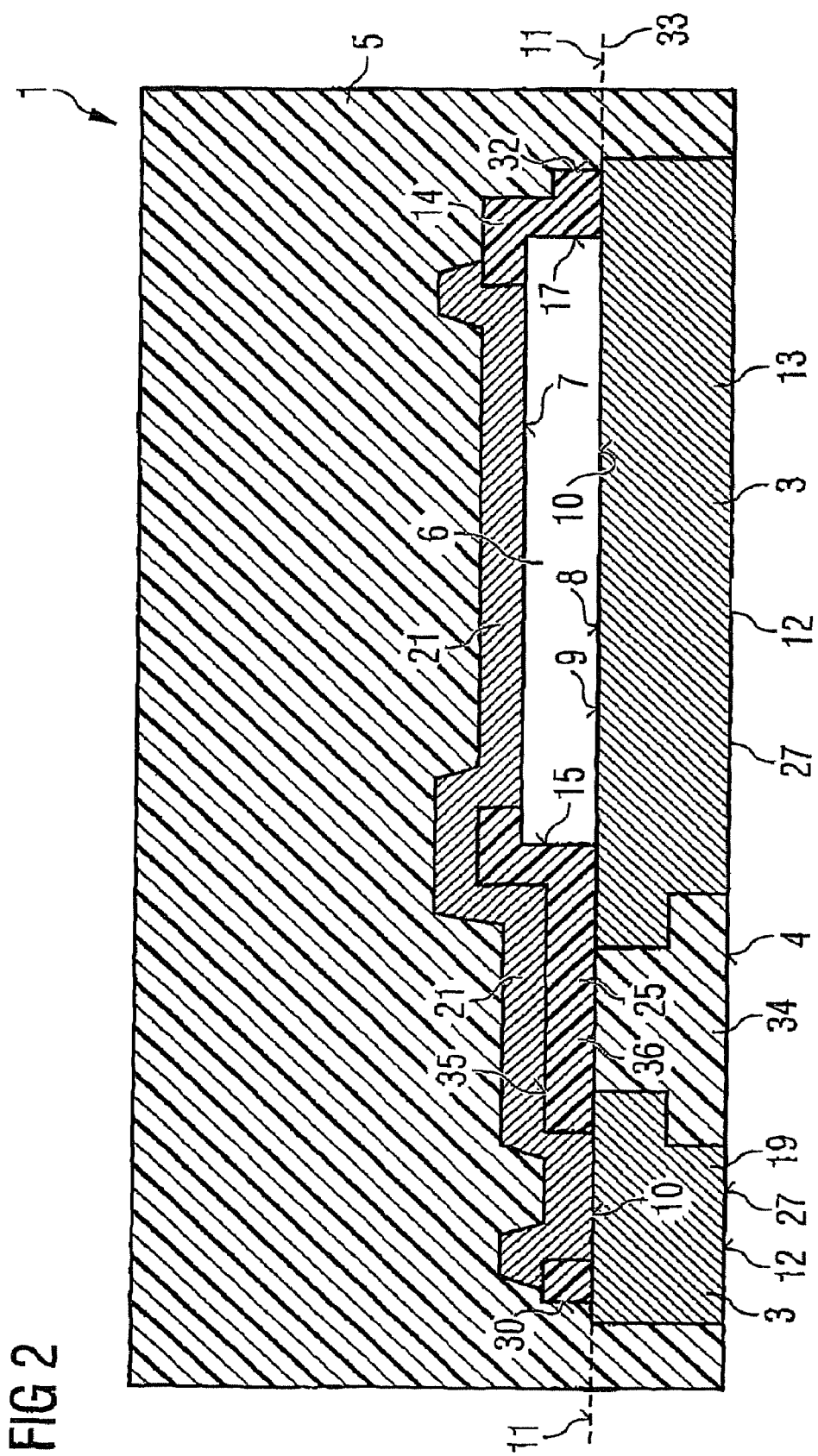
FIG. 2 illustrates a schematic cross section through the power semiconductor module in accordance with FIG. 1 along the sectional line A-A.

FIG. 1 illustrates a schematic plan view of a power semiconductor module 1 of a first embodiment, and FIG. 2 illustrates a schematic cross section through power semiconductor module 1 of FIG. 1 along sectional plane A-A. This power semiconductor module 1 is arranged in a plastic housing 5 including flat external contacts (leadless package). In this plan view, in order to illustrate the components which are embedded in the power semiconductor module 1 or the plastic housing 5, the plastic housing composition 5 has been omitted and merely the external contour of the plastic housing 5 is illustrated by a dashed line 28.

In this embodiment, a power semiconductor chip 6 is provided which has a first, or top side 7 and a second or rear side 4. A first load connecting area 23 and a gate connecting area 24 are positioned on the first side 7 and a second load connecting area 9 is positioned on the rear side 4. The semiconductor chip 6 is embodied as a vertical MOSFET device so that the first load connecting area 23 is conventionally named source and the second load electrode 9 is conventionally named drain.

The topmost component that can be seen in said plastic housing composition 5 is a large-area connecting layer 21, which extends areally over the largest part of the top side 7 of the power semiconductor chip 6, the top side 7 having the contact pad 23 for a multiplicity of source electrodes of the power semiconductor chip 6, on which this source connecting area 23 is arranged and which simultaneously projects beyond the edge 15 of the semiconductor chip 6 and extends as far as the regions of top side 10 of source external contacts 19.

Said connecting layer 21 is arranged on a large-area insulation film 25 having the edge sides 29, 30, 31 and 32, said insulation film 25 not only carrying the connecting layer 21 but also having a connecting layer 22, which connects the gate contact area 24 on the top side 7 of the semiconductor chip 6 to the top side 10 of a gate external contact 20. The conductive connecting layers may either be applied in patterned fashion through a mask or be applied in a large-area fashion and subsequently be patterned by using a photolithographic process and subsequent etching process.

The insulation film 25 serves as an insulation layer 14 and also covers the trenches 34 between the external contacts 13, 19 and 20. Below the insulation film 25, the semiconductor chip 9 with its edge sides 15, 16, 17 and 18 is arranged on the external contact 3 on the left-hand side of FIG. 1.

The rear side of the semiconductor chip 6 (not visible in FIG. 1), has a drain contact area that takes up the entire rear side of the semiconductor chip 6. With this drain contact area, the semiconductor chip 6 is arranged on the top side 10 of a drain external contact 13, the areal extent of which, in this embodiment, is larger than areal extent of the semiconductor chip 6, so that the semiconductor chip 6 can be securely fixed on the large-area drain external contact 13 whilst observing the possible placement tolerances. The top sides 10 of the external contacts 3 are arranged in coplanar fashion in a housing plane and project with their undersides (not shown in FIG. 1) as external contact areas on the underside of the plastic housing 5.

FIG. 2 illustrates a schematic cross section through the power semiconductor module 1 in accordance with FIG. 1 along the sectional plane A-A. Components having functions identical to those in FIG. 1 are identified by the same reference symbols and are not explained separately. As illustrated by this cross section of FIG. 2, the power semiconductor module 1 is constructed on a flat conductor frame, the external contact areas 3 of which are illustrated, the undersides 12 of which external contact areas project on the underside 4 of the semiconductor module 1 of the plastic housing 5 or are at least free of a plastic housing composition 5.

In this cross-sectional plane, on account of the sectional plane A-A of FIG. 1, it is possible to see the cross section of the large-area drain external contact 13 and of a source external contact 19 with their external contact areas 27, the top sides 10 of which are arranged in coplanar fashion in an inner housing plane 11, the position of which is illustrated by the dashed line 33. The semiconductor chip 6 is fixed by its rear side 8, which has a drain contact area 9, on the top side 10 of the drain external contact 13. An insulation film 25 that is dimensionally stable at room temperature is laminated onto the top side 7 of the semiconductor 6 in the edge regions 15 and 17.

The insulation film 25 made of a thermoplastic material is pressed onto the support during lamination and heated, so that it clings to the edge sides 15 and 17 of the semiconductor chip 6, and forms a stable bridge 36 over the trenches 34 between the external contacts 19 and 13 after cooling down at room temperature. A continuous source connecting layer 21 can then be deposited on said insulation film 25, which source connecting layer electrically connects the source contact areas on the top side 7 of the semiconductor chip 6 to the top sides 10 of the source external contacts 19 in large-area fashion.

The production of said connecting layer 21 extending from the top side 7 of the semiconductor chip 6 as far as the top side 10 of the source external contacts 19 can be effected by depositing two plies, namely a first metal ply as adhesion-promoting and/or diffusion-inhibiting ply, and a further ply as a low-resistance electrical connecting layer 21. For this purpose, firstly a metal is applied which adheres well both on the top side 7 of the semiconductor chip 6 and on the top side 35 of the film. This metal coating is subsequently used for depositing a low-resistance layer having a sufficient thickness made of copper or a copper alloy on said metal layer, which is also called a seed layer. The deposition may be continued until a low-resistance electrical connection has been achieved between the contact areas on the top side 7 of the semiconductor chip and the top sides 10 of the external contacts 3.

During the concluding embedding of these components of the power semiconductor module 1 into a plastic housing composition 5, the trenches 34 between the external contacts 3 are also filled with plastic housing composition 5, thereby supporting the bridge 36 formed from the insulation film 25 for corresponding metallic connecting layers 21. In contrast to a connecting technique including bonding wires, it is not possible for drifting of bonding wires and thus undesired short circuits to occur during the embedding of the components of the power semiconductor module 1. Furthermore, the laminated-on insulation film 25 adapted to the surface contour of the semiconductor chip 6 and to the inner housing plane 11 enables the application of a large-area and thick wiring structure within the plastic housing composition.

Figure 3:
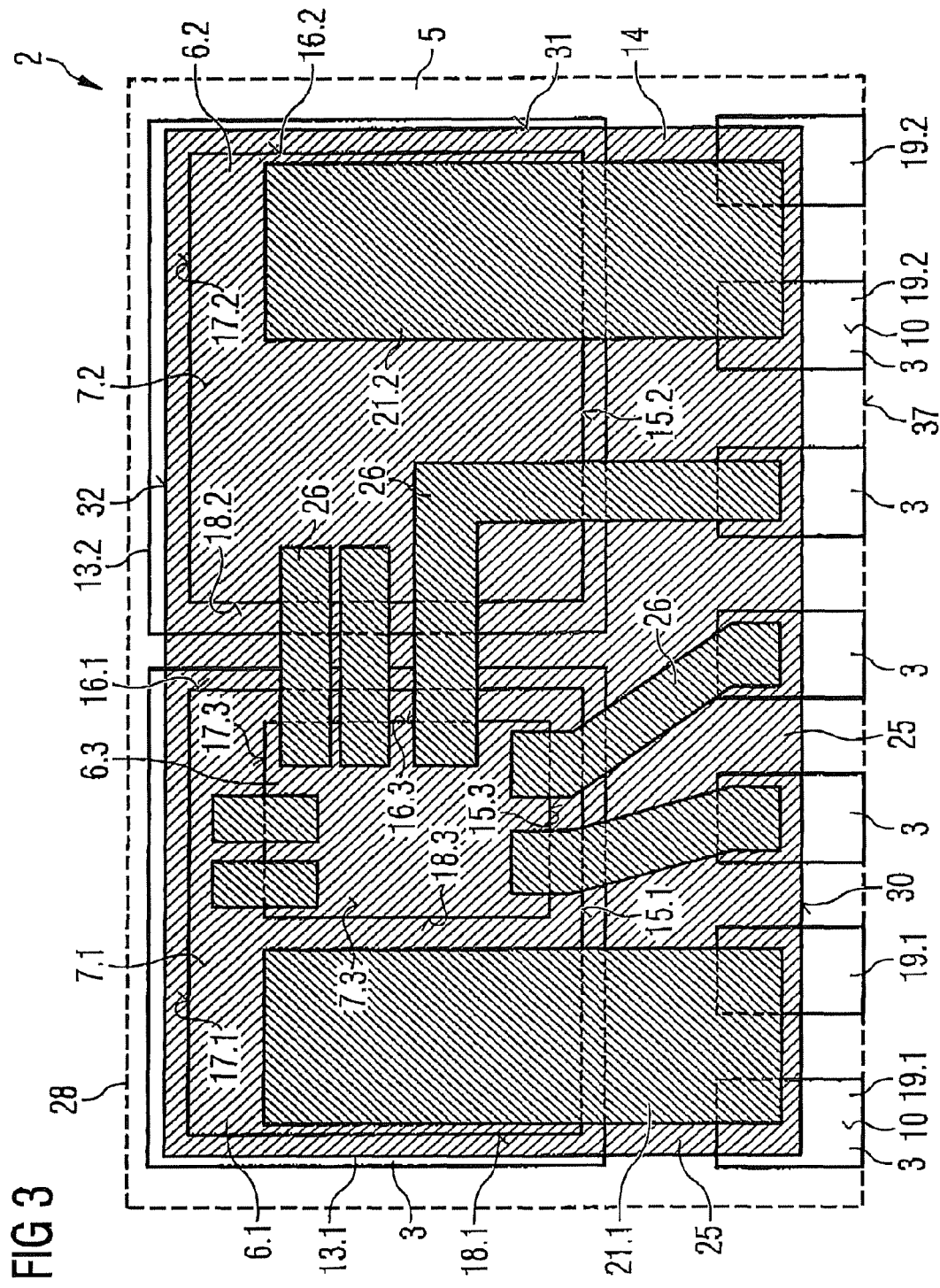
FIG. 3 illustrates a schematic plan view of a power semiconductor module of a second embodiment.

FIG. 3 illustrates a schematic plan view of a power semiconductor module 2 of a second embodiment. Components having functions identical to those in FIG. 1 are identified by the same reference symbols and are not explained separately.

In this embodiment, within the plastic housing 5, the external contour of which is identified by a dashed line 28, two power semiconductor chips 6.1 and 6.2 are connected to corresponding top sides 10 of external contacts 3, the power semiconductor chip 6.1 having a logic semiconductor chip 6.3 on its top side 7.1. An insulation film 25 with its edge sides 29, 30, 31 and 32 is arranged on the top sides 7.1, 7.2 and 7.3 of the semiconductor chips 6.1, 6.2 and 6.3 and also in part on the top sides 10 of the external contacts 3, said insulation film covering the edge sides 15.1 to 18.1, 15.2 to 18.2 and 15.3 to 18.3 of the semiconductor chips 6.1, 6.2 and 6.3.

This insulation layer 14 in the form of an insulation film 25 has arranged on it not only connecting layers 21.1 and 21.2, which connect the source contact areas of the semiconductor chips 6.1 and 6.2 to corresponding source external contacts 19.1 and 19.2, but also further connecting layers 26, which connect contact areas of the stacked logic semiconductor chip 6.3 to contact areas of the power semiconductor chip 6.1 and of the power semiconductor chip 6.2, respectively.

Figure 4:
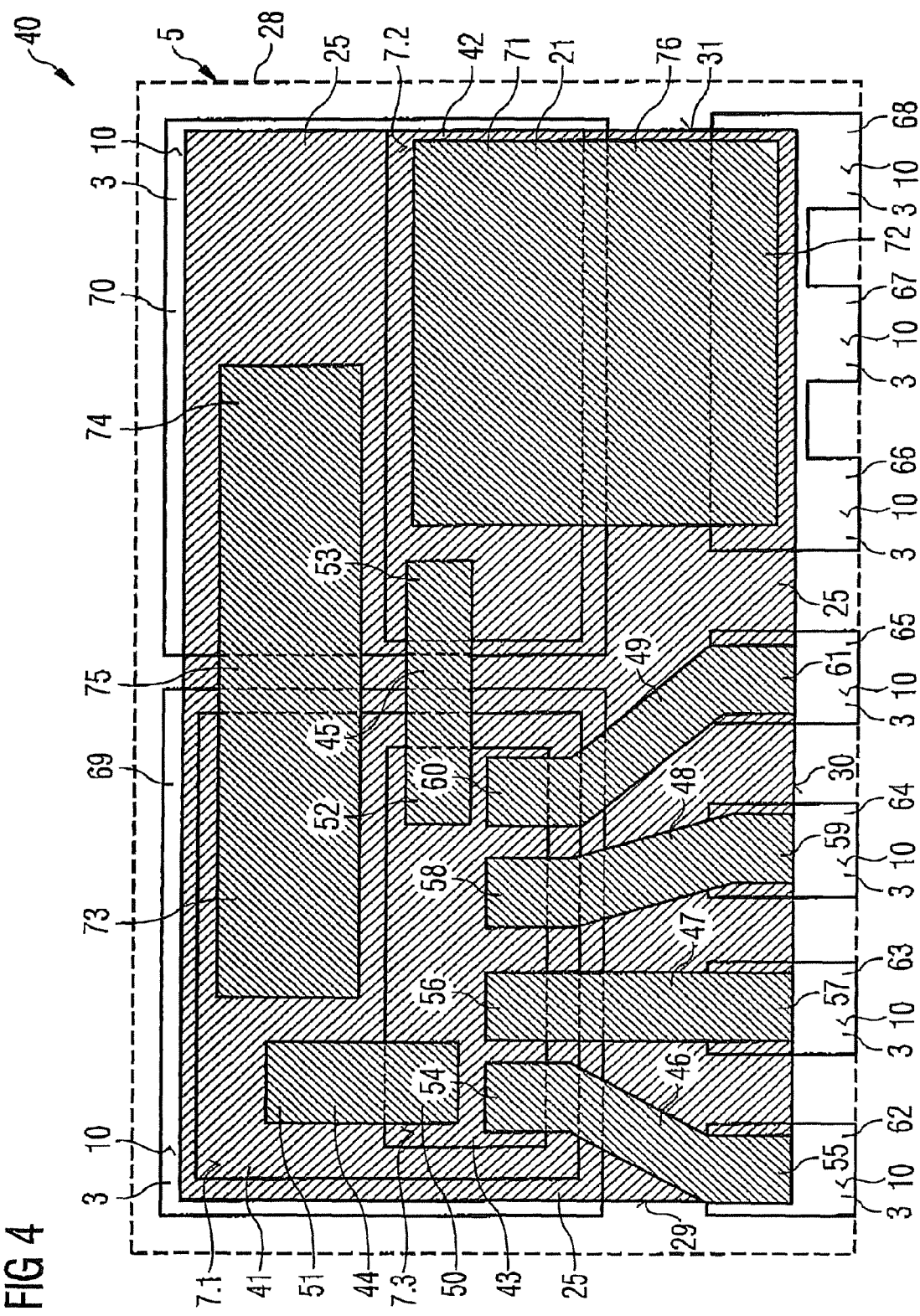
FIG. 4 illustrates a schematic plan view of a power semiconductor module of a third embodiment.

FIG. 4 illustrates a schematic plan view of a power semiconductor module 40 of a third embodiment. Components having functions identical to those in the previous figures are identified by the same reference symbols and are not explained separately.

FIG. 4 illustrates active components of a voltage regulator, the plastic housing composition having been omitted for the sake of better clarity and merely the contour of the plastic housing 5 being illustrated by using a dashed line 28. In this embodiment, within the plastic housing 5, two power semiconductor chips or power ICs 41 and 42 are connected to corresponding top sides 10 of external contacts, the power semiconductor chip 41 carrying a stacked logic semiconductor chip 43 on its top side 7.1. An insulation film 25 with its edge sides 29, 30, 31 and 32 is arranged on the top sides 7.1, 7.2 and 7.3 of semiconductor chips 41, 42 and 43 and also in part on the top sides 10 of the external contacts 3, said insulation film covering the edge sides of the semiconductor chips 40, 41 and 42. At the same time, said insulation film 25 bridges interspaces between the external contacts 3.

Furthermore, the insulation film 25 has openings for contact areas on the semiconductor chips 40, 41 and 43, and also openings to contact pads on the top sides 10 of the external contacts 3, so that there may be arranged on the insulation film 25 a laminate with patterned striplines 44 to 49 and also 75 and 76, which in part connect the semiconductor chips 40, 41 and 43 among one another and in part connect them to the top sides 10 of the external contacts 3 through the insulation film 25.

The external contacts 62, 63, 64 and 65 are assigned to the logic semiconductor chip and are connected to contact areas 54, 56, 58 and 60 of the logic IC via their contact pads 55, 57, 59 and 61 arranged on the top sides and also the striplines 46, 47, 48 and 59. The logic IC can thus be driven via said external contacts 62, 63, 64 and 65. The logic IC itself is electrically connected to the gate of the first power semiconductor chip 41 via its contact area 50 via the stripline 44 and also via the gate contact area 51 of the first power semiconductor chip 41.

The second power semiconductor chip 42, which is likewise covered only in part by the insulation film 25, is driven by the stacked logic semiconductor chip 43 via the contact area 52 and the stripline 45 and also the gate contact area 53 of the second power semiconductor chip 42.

Besides these signal striplines 44, 45, 46, 47, 48, the logic semiconductor chip 43 stacked on the first power semiconductor chip 41 is electrically connected to corresponding external contacts 62, 63, 64 and 65 and also to gate contact areas 51 and 53 of the two power semiconductor chips 41 and 42.

Furthermore, the power semiconductor module has high-current striplines 75 and 76, which, on the one hand, connect the source contact area 73 to the drain contact area 74 on the top side 10 of the drain external contact 70 of the second power semiconductor chip 42, and a further high-current stripline 76, which connects the source contact area 71 of the second power semiconductor chip 42 to a contact pad 72 on the top side 10 of the source external contacts 66, 67 and 68. Both the high-current striplines 75 and 76 and the signal striplines 44 to 49 can bridge the interspaces between the external contacts since they are supported by the large-area insulation film extending both over the top sides of the semiconductor ICs 41, 42 and 43 and over the top sides of the external contacts 62 to 70 whilst bridging the interspaces between the external contacts.

FIG. 5 illustrates the deposition of an electrically conductive connecting layer 100 according to a fourth embodiment. The electrically conductive connecting layer 100 may be used to provide a source connecting layer 21 and gate connecting layer 22 provided in the power conductor modules according to the embodiments illustrated in FIGS. 1 to 4.

The method of depositing the electrically conductive connecting layer 100 is illustrated for the power semiconductor module of the first embodiment illustrated in FIGS. 1 and 2. However, the method is not limited to this embodiment and by way of example may be used to provide the connecting layers 21, 22 in the power semiconductor modules illustrated in FIGS. 3 and 4.

The connecting layer 100 is deposited by applying a layer 101 including electrically conductive nanoparticles 102 to the top side 35 of the insulation layer 14 and to the exposed areas of the source contact area 23 and gate contact area 24 as well as the exposed areas of the source external contact 19 and gate external contact 20.

The layer 101 of electrically conductive particles 102 may be deposited by providing a liquid in the form of a solvent 103 which includes a suspension of electrically conductive nanoparticles 102. The solvent may be acetone or toluene and the nanoparticles may be copper, silver or gold, for example. The liquid may also include dispersion agents in order to maintain the nanoparticles 102 in a suspension within the liquid and prevent their agglomeration.

In a further embodiment, the liquid is provided in the form of a polymer resin which includes a suspension of electrically conductive particles 102. The liquid may have in this embodiment the consistency of a paste.

The layer 101 of electrically conductive nanoparticles 102 may be applied in the form of a closed layer across the upper side 7 of the semiconductor chip 6, the upper side 35 of the insulation film 14 and external contacts 3. Alternatively, the layer 101 of electrically conductive nanoparticles 102 may be selectively applied so as to provide a patterned layer including source connecting layer 21 and gate connecting layer 22 which are separate from another and electrically isolated from one another by regions of the insulation layer 14 extending between them which are uncovered by the electrically conductive layer.

After the layer 101 of electrically conductive nanoparticles 102 is deposited, the solvent 103, and in the non-illustrated embodiment the polymer resin, is removed. This may be carried out by allowing the solvent 103 to evaporate and/or applying heat in order to expedite the evaporation of the solvent 103. If further additives are provided in the liquid as applied, the heat may also cause the decomposition of these components and their removal from the deposited layer 101.

After the removal of the additional components of the liquid, a layer 100 of electrically conductive nanoparticles 102 remains which extends between the source contact area 23 and the source external contacts 19 and the gate contact area 24 and the gate external contact 20.

The layer 100 of electrically conductive nanoparticles 102 may be applied by a printing technique. The printing technique may be used to apply a patterned layer of electrically conductive nanoparticles 102 to form a source connecting layer 21 and a gate connecting layer 22 which are electrically isolated from one another by uncovered regions of the insulation layer 14.

In an embodiment, the patterned layer is formed using a printing technique by printing through a patterned mask.

In a further embodiment, a source connecting layer 21 and gate connecting layer 22 which are electrically isolated from one another may be formed by a selective printing technique.

The selective printing may be carried out by an inkjet printing technique. The movement of the deposition nozzle of the inkjet printer, illustrated schematically in FIG. 5 and indicated by the reference number 104, over the upper surface of the insulating film 14 and exposed regions of the semiconductor chip 6 and external contacts 3 is controlled, for example by an appropriately programmed computer, in order to deposit the layer 101 of electrically conductive nanoparticles 102 in only those regions in which it is desired to provide an electrically conductive connecting layer from the source contact area 23 to the source external contacts 19 and from the gate contact area 24 to the gate external contacts 20.

After the solvent 103 is removed from the deposited layer 101, an electrically conductive connection is provided between the source contact area 23 and source external contact 19 as well as from the gate contact area 24 to the gate external contact 20. The nanoparticles 102 of the layer 100 are now linked together to provide a macroscopically electrically conductive path. This is illustrated in FIG. 6.

FIG. 6 illustrates a method according to a fourth embodiment of the invention by which the layer 100 may be deposited. The method illustrated in FIG. 6 is carried out after the deposition of the layer 101 of electrically conductive nanoparticles 102.

Depending on the electrical resistance of the deposited layer 100, it may be desirable to increase the thickness of the layer 100 in order to reduce the electrical resistance. In particular, it may be desirable to increase the thickness of only the source connecting layer 21 or both the gate connecting layer 22 and the source connecting layer 21.

In an embodiment, the final thickness of the source connecting layer 21 may be greater than the thickness of the gate connecting layer 22. This may be desirable since the load placed on the source connecting layer 21 is typically greater than that placed on the gate connecting layer 22. The lower electrical resistance is achieved by providing a thicker layer for the source connecting layer 21.

The thickness of the layer 100 may be increased by electrodepositing a further electrically conductive layer on to the layer 100 of electrically conductive nanoparticles 102. In this context, electroposition is used to indicate a galvanic deposition in which they voltage from an external source is applied to the connecting layer which is to the thickened.

In a further embodiment, an electroless galvanic deposition technique is used to apply a further electrically conductive layer to the layer 100 of electrically conductive nanoparticles 102.

The deposition of the further electrically conductive layer is illustrated in FIG. 6 by the arrows 105.

After the semiconductor chips 6 and other electronic components, if provided, of the power module 1 are mounted on the chip carrying external contacts, in this case the drain external contact 13, an insulating layer 14 is applied to the upper surface of the semiconductor chips 6 and external contacts 3. The insulating layer 14 bridges the gaps 34 between the semiconductor chip carrying external contact 13, that is the drain external contact 13, and the further external contacts 3 which are spaced at a distance from the drain external contact 13 as well as the gaps between the further external contacts 3, in this case between the source external contacts 19 and gate external contact 20.

The insulation layer 14 may be applied by laminating a polymer foil, by coating the components with a liquid polymer or by using a partial premolding of the desired areas. The insulation layer 14 is removed locally so as to expose contact areas on the top side of the semiconductor chip 6, in this case the source contact area 23 and the gate contact area 24, and to expose areas on the top side 10 of the external contacts 3 to which the chip contact areas are to be electrically connected. The through holes exposing these contact regions may be produced lithographically if a photosensitive insulation material is used. Alternatively, laser ablation could be used.

In a further embodiment, the insulation layer 14 may be selectively deposited, for example by printing using an inkjet printer. In this embodiment, the deposition and patterning of the insulation layer 14 are carried out simultaneously.

After the application of the insulation layer 14, a dispersion of electrically conductive nanoparticles 102 in a liquid or a formulation of electrically conductive nanoparticles 102 in a polymer in the form of a paste or a polymer precursor formulation is applied to the insulating layer 14 in order to make the connections between the contact areas 23, 24 on the semiconductor chip 6 and external contacts 3 as well as between the semiconductor chips in the case of multi-chip packages, for example the multi-chip packages as illustrated in FIGS. 3 and 4.

The applied liquid layer 101 is heated and the solvent 103 and other components of the liquid 101 are removed and the nanoparticles 102 agglomerate. This agglomeration is driven by the surface energy of the nanoparticles 102. The agglomeration of the nanoparticles 102 forms an electrically conductive layer 100 between the semiconductor chip 6 and the external contacts 3 as well as between the semiconductor chips 6 in the case of multi-chip packages.

In power packages, a further process may be carried out to enhance the power interconnects in order to provide a greater amppacity. This can be done by using a plating process. The semiconductor chip-to-external contact connections can be electroplated by using the lead frame as an electrode. However, chip-to-chip connections are plated chemically as in a chemical deposition process that is by electroless galvanic deposition.

If an additional electrodeposited layer is not intended to be deposited on some metallic surfaces, these surfaces may be covered before the electroposition of the further uncovered electrically conductive surfaces takes place. This may be done by applying a photoresist before the uncovered areas are plated to increase the thickness of the layer in these regions. After this electrodeposition process, the photoresist may be removed if these thinner electrically conductive regions are to be revealed.

FIGS. 7 to 12 illustrate a method for producing a semiconductor power module according to a sixth embodiment. The method is illustrated by example for the production of the power semiconductor module 1 illustrated in FIGS. 1 and 2. However, the method is not limited to the production of the power semiconductor module 1 but may be used to manufacture any electronic component having a planar interconnect technology.

Figure 7:
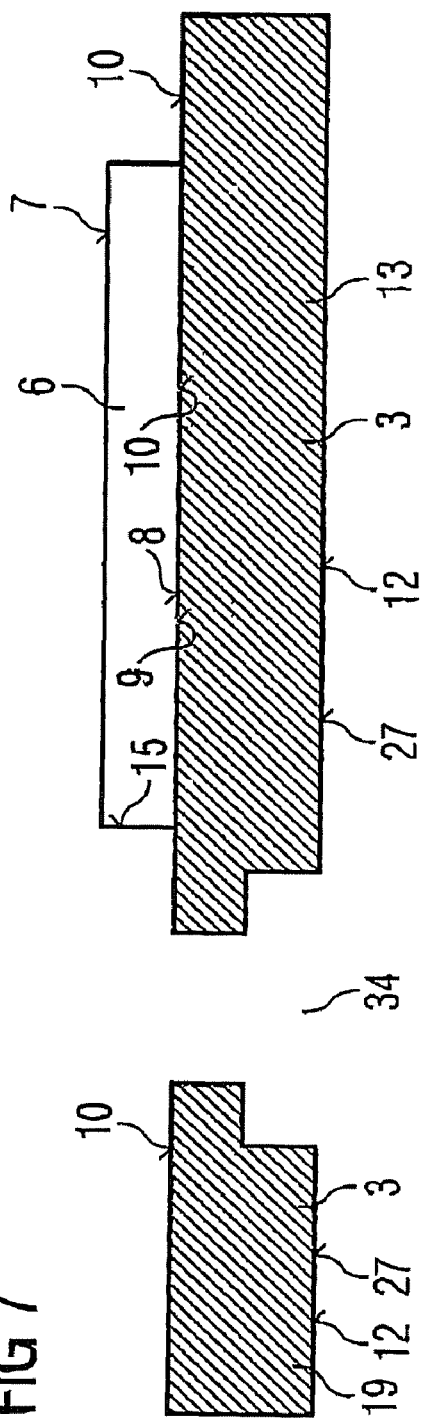

FIG. 7 illustrates a cross-sectional view of a component position of a leadframe strip which includes a plurality of component positions, each including a drain external contact 13 and four external contacts 19, 20 which form the source external contact and gate external contact, respectively. The external contacts 3 are provided in the form of portions of a copper plate which has been stamped or etched to produce a plurality of component positions which are held together by tie bars in a leadframe strip.

The source external contact 19 and gate external contact 20 are spaced at a distance from one side face of the drain external contact 13 so that a trench or space 34 is present between them. In view of FIG. 7, the power semiconductor chip 6 has been mounted onto the top side 10 of the external drain contact 13.

Figure 8:
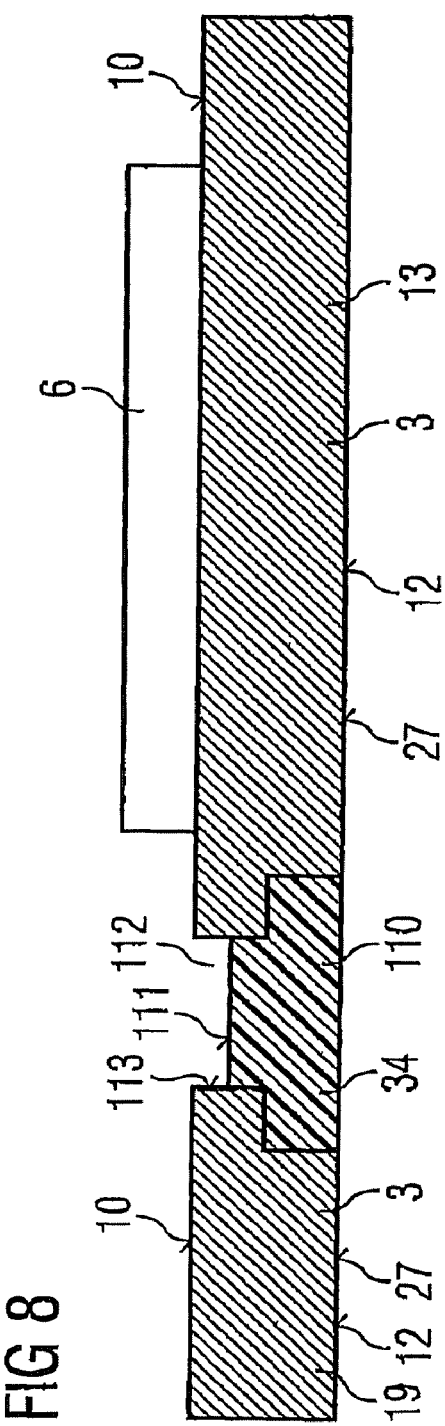

FIG. 8 illustrates the introduction of filler material 110 into the spaces 34 between the source external contacts 19, the gate external contact 20 and the drain external contact 13. The material 110 includes a thermoplastic such as polypropylene, polycarbonate or Polyamide 66. The spaces 34 between the external contacts 3 are filled by the filler material 110 by immersing the underside 12 of the external contacts 3 in a bath of molten thermoplastic material up to a predetermined depth.

The upper surface 111 of the filler material 110 positioned in the spaces 34 is illustrated in FIG. 8 as lying in a plane slightly below the top side 10 of the external contacts 3. In other non-illustrated embodiments, the upper surface 111 of the filler material 110 may be positioned so that the remaining depression 112 between the upper surface 111 of the filler material 110 and the exposed side faces 113 of the external contacts 3 is a small as possible. The height to which the space 34 is filled with filler material 110 is controlled by the depth to which the rear side 12 of the external contacts 3 is immersed in the thermoplastic bath.

By controlling the depth of immersion, the top side 10 of the external contacts 3 may be kept free from the filler material 110 so as to avoid the need for additional cleaning processes to remove filler material 110 from the upper surface 10 of the external contacts 3.

The bath of thermoplastic may have a temperature of around 200° C. which is suitable for holding a range of thermoplastic materials in the molten state and is also sufficiently low so as not to damage the die attach connection between the rear side 8 of the semiconductor chip 6 and the top side 10 of the drain external contact 13. The thermoplastic material has a high viscosity in the molten state so that the filling of the gaps or spaces 34 can be controlled accurately. The thermoplastics are remeltable so that a filler material in the form of the thermoplastic can be removed by remelting the thermoplastic when the insulation layer is in a self-supporting state.

Alternatively or in addition, the thermoplastic material may be removed by dissolving it in an appropriate solvent. In this case, it is useful if the material of the insulation layer 14 is insoluble in this solvent.

If the polymer of the insulation layer 14 is applied in the liquid state, the applied liquid layer may be given a pre-baking treatment at a temperature lower than the melting temperature of the thermoplastic. During this pre-baking heat treatment, the insulation layer 14 solidifies as the solvent is removed. Typical pre-baking temperatures may be 80° C. to 250° C. The thermoplastic filler material 110 may then be removed while the insulation layer 14 is in this precured condition. In this case, an organic solvent or other solvent may be used to remove the thermoplastic filler material 110.

In a further embodiment, the thermoplastic filler material 110 is removed by remelting it during the curing of the insulation layer 14. In this case, the curing temperature of the insulation layer material 110 is higher than the melting temperature of the thermoplastic which is in turn higher than the pre-baking temperature of the insulation layer 14.

In a further embodiment, the insulation layer 14 is cured and, afterwards, the thermoplastic filler material 110 is removed by melting. In this case, the melting temperature of the thermoplastic is higher than the curing temperature of the insulation material. The cured insulation material has a higher melting temperature and/or decomposition temperature than the thermoplastic in order that it is not damaged during the removal of the filler material 110.

The thermoplastic may be polypropylene which has the melting temperature of around 170° C. and can be removed by solvents such as alkanes, in particular hexane. Polycarbonate may also be used as a thermoplastic filler material. Polycarbonate has a melt temperature of around 220° C. and is soluble in aromatic carbon hydrogen compounds or ether.

A further example of a suitable thermoplastic filler material is polyamide 66 (PA66) which has a melt temperature of around 260° C. Polyamide 66 is soluble in weak acids and organic halogen compounds.

The filler material 110 is not limited to thermoplastics. In principle, any material which can be removed may be used.

In a further embodiment, the filler material 110 is a thermosetting plastic. The thermosetting plastic may be in the molten state at temperatures of 120° C. to 180° C. The spaces 34 in the lead frame may be filled at these temperatures. Since this material is thermosetting, it remains solid at this temperature if it is reheated to this temperature. The thermosetting plastic may be removed using wet chemical techniques and may be removed by suitable bases, for example, depending on the composition.

In a further embodiment, the filler material 110 may be an elastomer. The elastomer in its initial form includes sulfur and peroxide and may be in a molten intermediate state at temperatures in a range of 20° C. to 160° C. The elastomer is introduced into the gaps at temperatures within this range and hardens at this temperature in a similar fashion to a thermosetting plastic. An elastomer as filler material 110 may be removed by wet chemical techniques, for example by the use of alkanes.

Figure 9:
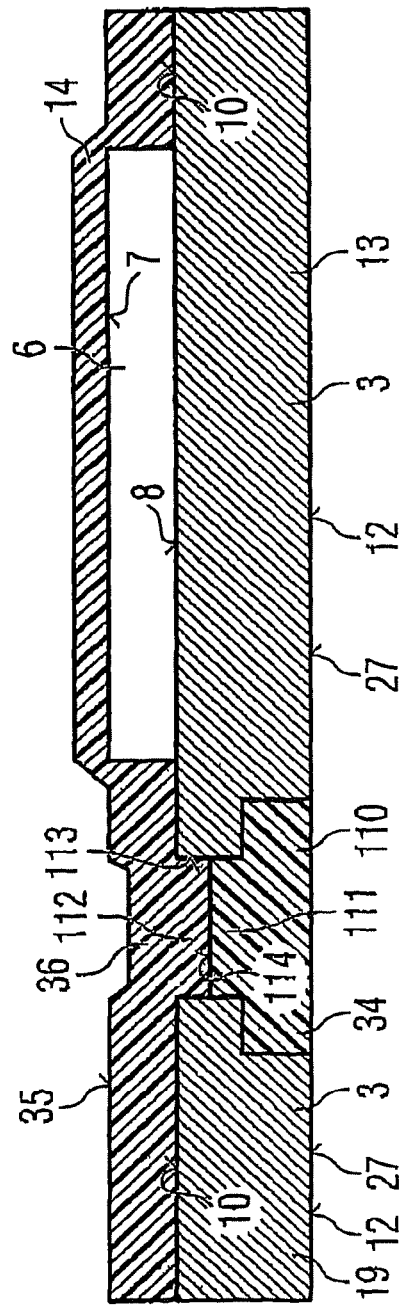

FIG. 9 illustrates the application of the insulating layer 14 to the top side 7 of the semiconductor chip 6, the top side 10 of the external contacts 3 and the top surface 111 of the filler material 110. Since the filler material 110 largely fills the spaces 34 between the external contacts 3, the position and form of the lower surface 114 of the insulation layer 14 in the region 36 which bridges the spaces 34 between the external contacts 3 is determined by the position and form of the upper surface 111 of the filler material 110. Consequently, the bridge region 36 may be provided with a planar structure if the upper surface 111 of the filler material 110 is planar.

The insulation layer 14 may be applied in the form of a polymer film which may be applied by a lamination technique, as a polymer in liquid form which may be applied by spraying spinning dipping or printing or may be deposited by vacuum deposition techniques such as chemical vapour deposition.

The insulation layer 14 may include a photo sensitive material such as polyimide, bezocyclobutene (BCB) or polybenzoxazol (PBO). These materials are photo structured to exposed regions of the top side 7 of the semiconductor chips 6 and top side 10 of the external contacts 3, in particular regions of the top side of the source external contact 19 and gate external contact 20 which are to be electrically connected. After photostructuring, an annealing treatment is carried out to cure the photosensitive insulation layer 14.

The curing annealing treatment is carried out at a temperature which is higher than the melting point of the thermoplastic and suitable for curing the material of the insulation layer 14. During this curing annealing treatment, the thermoplastic filler material 111 melts and flows out of the gaps 34 between the external contacts 3 leaving them empty in regions underneath the bridge 36 of the insulation layer 14.

Figure 10:
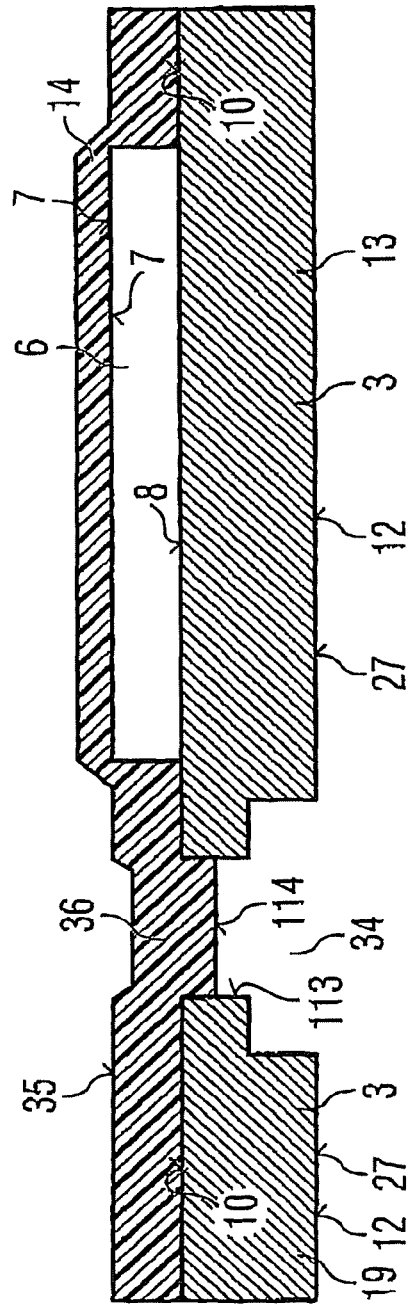

After the removal of the filler material 111 from the gaps 34, the insulation layer 14 is suspended across the gaps 34 between the external contacts 3 in the bridge regions 36. This is illustrated in FIG. 10.

After the production of the insulation layer 14 with through holes 118 in which the source contact area 23 and gate contact area 24 as well as regions of the top side 10 of the source external contact 19 and gate external contact 20 are exposed, an electrically conductive connecting layer 115 is deposited.

The electrically conductive connecting layer 115 may be fabricated by any of the methods previously described in order to produce a source connecting layer 21 and the gate connecting layer 22, which are electrically isolated from each other by regions of the insulation layer 14. The source connecting layer 21 may have a thickness of 100 μm or more whereas the gate connecting layer 22 may have a smaller thickness, for example around 10 μm.

In an embodiment of a method to produce an electrically conductive connecting layer 115, a seed layer 116 is first deposited. The seed layer 116 can function as a diffusion barrier in the regions in which it is in contact with the contact areas, that is the source contact area 23, gate contact area 24 and exposed areas of the top side 10 of the external contacts 3. The seed layer 116 may also act as the adhesion promotion layer in regions in which it is in contact with the insulation layer 14.

In a further embodiment, the seed layer 116 may be selectively deposited on either the exposed metallic areas in order to form a diffusion barrier or exposed areas of the insulation layer 14 in order to promote adhesion between the electrically conductive connecting layer 115 and the insulation layer 14. It is also possible that seed layers 116 of different compositions may be selectively deposited in order to achieve these two functions.

After the deposition of the seed layer 116, a further layer 117 is deposited to form the connecting layer 115. The further layer may be deposited by galvanic techniques, such as electrodeposition and electroless galvanic deposition.

The connecting layer 115 may be deposited as a closed layer which is, after its deposition, structured to produce a source connecting layer 21 and a gate connecting layer 22 which are electrically isolated by other from each other by regions of the insulation layer 14. Alternatively, the connecting layer 115 may be selectively deposited by the use of a mask in the form of a foil or a resist.

If connecting layers of different thicknesses are desired, the combination of the lithographic structuring and galvanic deposition may be repeated.

In an embodiment, the seed layer 116 remains as a closed layer during the selective deposition of the further galvanically deposited connecting layers 21, 22. The seed layer may then be removed from the areas between the connecting layers 21, 22 by an etch process, in particular a selective etch process in which the material of the seed layer 116 and not of the connecting layers is removed.

The seed layer 116 and galvanically deposited layer 116 may include different metals. For example, the seed layer 116 may be titanium and the galvanically deposited layer 117 may be copper.

In a further embodiment, the seed layer 116 is selectively deposited by the use of photostructuring techniques or a mask or may be selectively deposited in the regions where the connecting layers 21, 22 desired by a printing process.

FIG. 12 illustrates the power semiconductor module 1 after the components illustrated in FIG. 11 have been subjected to a molding process in order to encapsulate the electrically conductive layer 115, insulation layer 14 and top side 10 and side faces 112 of the external contacts 3 in a plastic housing composition 5. The outer side faces 116 and underside 12 of the external contacts 3 remain uncovered by the plastic housing composition 5.

In the embodiment illustrated in FIG. 12, the rear side 117 of the plastic housing composition 5 positioned in the spaces 34 between the external contacts 3 is illustrated as being essentially coplanar with the underside 12 of the external contacts 3. However, in a non-illustrated embodiment, the underside 12 of the external contacts 3 protrudes from the underside 112 of the plastic housing composition 5. The semiconductor power module 1 is a leadless package.

The spaces or gaps 34 between the external contacts 3 are temporarily filled by a filler material 110 during the application of the insulating layer 14 to the top side 7 of the semiconductor chip 6 and top side 10 of the external contacts 3. This enables the insulating layer 14 to be applied in liquid form since the filler material 110 supports the liquid insulating layer 14 in the gaps 34 before the insulating layer 14 is cured or hardened and becomes self-supporting.

The filler material 110 may also be used for an insulation layer 14 which is applied in the form of a self-supporting polymer film. In this case, the filler material 110 provides additional support to form bridge regions 36 between the external contacts 3 in the insulation layer 14 which are more planar since the degree to which the film can sink under its own weight in the bridge regions 36 is limited by the filler material 110.

Since the filler material 110 is removed after the production of a self-supporting insulation film 14, the finished power semiconductor module may also be fully encapsulated, apart from the external contact areas on positioned on the underside of the module 1, in a plastic housing composition 5. This provides a good barrier against environmental damage, such as moisture penetration, as well as providing an improved electrical isolation of the external contacts 3 from each other since the side faces and top surfaces 10 of the external contacts 3 are embedded in the plastic housing composition 5.

Since in the method of the sixth embodiment, the insulation layer 14 may be applied in liquid form, photosensitive materials can be used since these are typically applied in liquid form. Photosensitive materials for the insulation layer 14 have the advantage that the structuring of the insulation layer 14 to expose the source contact area 23, gate contact area 24 and contact areas on the top surface 10 of the source external contact 19 and gate external contact 20 can be carried out by standard photostructuring techniques which are relatively fast. This avoids the need to remove regions of the insulation layer by techniques such as laser ablation which tend to be slower.

Furthermore, by applying the material for the insulation layer 14 in liquid form, a good surface coverage and reliable embedding of the components by the liquid can be achieved. The adhesion of the liquid to the components may also be improved.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method comprising:
providing a leadframe comprising an arrangement of metallic external contacts spaced apart from one another including a first load external contact, a second load external contact, and a gate external contact, wherein rear sides of the metallic external contacts provide surface mountable contacts;
providing a semiconductor chip, a top side of the semiconductor chip comprising a first load contact area and a gate contact area and a rear side of the semiconductor chip comprising a second load contact area;
fixing the semiconductor chip by the second load contact area on a top side of the second load external contact of the leadframe;
applying an insulation layer to the top side of the semiconductor chip and to top sides of said the metallic external contacts, the insulation layer extending between the top side of the semiconductor chip and the top sides of the metallic external contacts and leaving free the first load contact area and the gate contact area of the semiconductor chip and partly leaving free the top sides of the first load external contact and the gate external contact of the leadframe; and
applying a liquid having a suspension of electrically conductive nanoparticles dispersed therein to a top side of the insulation layer;
removing the liquid so that only the electrically conductive particles remain and which thereby agglomerate to form a layer extending between the first load contact area and surfaces of the first load external contact and between the gate contact area and surfaces of the gate external contact.

2. The method of claim 1, wherein the liquid comprises a solvent.

3. The method of claim 1, wherein the liquid comprises a polymer resin having a paste-like consistency.

4. The method of claim 1, wherein after the layer of electrically conductive nanoparticles is applied, the layer of electrically conductive nanoparticles is patterned to form a first load connection and a gate connection which are electrically isolated from one another.

5. The method of claim 1, wherein a patterned layer of electrically conductive nanoparticles is applied by a printing technique to form a first load connection and a gate connection which are electrically isolated from one another.

6. The method of claim 5, wherein the printing technique includes using a patterned mask.

7. The method of claim 5, wherein selective printing is carried out by an ink jet printing technique to form a patterned layer of electrically conductive nanoparticles to form a first load connection and a gate connection which are electrically isolated from one another.

8. The method of claim 1, wherein a further electrically conductive layer is applied to the layer of electrically conductive nanoparticles.

9. The method of claim 1, wherein a further electrically conductive layer is applied to the layer of electrically conductive nanoparticles by electrodeposition.

10. The method of claim 1, wherein a further electrically conductive layer is applied to the layer of electrically conductive nanoparticles by electroless galvanic deposition.

11. The method of claim 1, wherein the layer of electrically conductive nanoparticles is conifgured to provide a first load connection and a gate connection which are electrically isolated from one another and a further electrically conductive layer is applied to the layer of electrically conductive nanoparticles providing the first load connection.

12. The method of claim 1, wherein a plastic housing composition is premolded for the purpose of applying a patterned insulation layer to edge sides and the top side of the semiconductor chip and to an inner housing plane.

13. A method comprising:
providing a leadframe comprising an arrangement of metallic external contacts arranged apart from one another by spaces and including a first load external contact, a second load external contact, and a gate external contact, wherein rear sides of the metallic external contacts provide surface mountable contacts;
providing a semiconductor chip, a top side of the semiconductor chip comprising a first load contact area and a gate contact area and a rear side of the semiconductor chip comprising a second load contact area;
fixing the semiconductor chip by its second load contact area on a top side of the second load external contact of the leadframe;
introducing filler material into the spaces of the leadframe,
after the filler material is introduced into the spaces of the leadframe, applying an insulation layer to the top side of the semiconductor chip and to top sides of the metallic external contacts, the insulation layer being at least partly in contact with an upper surface of the filler material, the insulation layer extending between the top side of the semiconductor chip and the top sides of the metallic external contacts and leaving free the first load contact area and the gate contact area and partly leaving free the top sides of the first load external contact and the gate external contact; and
applying an electrically conductive layer to a top side of the insulating layer by first applying a liquid having a suspension of electrically conductive nanoparticles dispersed therein and subsequently removing the liquid so that only the electrically conductive nanoparticles remain and which thereby agglomerate to form the electrically conductive layer, the electrically conductive layer extending between the first load contact area and top sides of the first load external contact and between the gate contact area and the top side of the gate external contact.

14. The method of claim 13, wherein the filler material is introduced into the spaces from the rear side of the external contacts.

15. The method of claim 13, wherein the filler material is introduced into the spaces by immersing the rear side of the external contacts into the filler material.

16. The method of claim 13, wherein the filler material is removed before the electrically conductive layer is deposited.

17. The method of claim 13, wherein the filler material is melted during curing of the insulation layer and flows away from the spaces to remove the filler material.

18. The method of claim 13, wherein the insulation layer is cured and afterwards the filler material is removed.

19. The method of claim 13, wherein the filler material is a thermosetting plastic.

20. The method of claim 13, wherein the filler material is an elastomer.

21. The method of claim 13, wherein the insulation layer is applied in liquid form and afterwards solidified.

22. The method of claim 21, wherein the insulation layer is applied by one of the group consisting of spraying, spinning, dipping, deposition or printing.

23. The method of claim 13, wherein the insulation layer is photosensitive and structured by photolithography to leave free the first load contact area and the gate contact area and partly leaving free the top sides of the first load external contact and the gate external contact from the insulation layer.

24. The method of claim 13, wherein the insulation layer is a film.

25. The method of claim 24, wherein the insulation is applied by lamination.

\* \* \* \* \*